United States Patent [19]

Beffa et al.

[11] Patent Number: 6,094,734
[45] Date of Patent: Jul. 25, 2000

[54] TEST ARRANGEMENT FOR MEMORY DEVICES USING A DYNAMIC ROW FOR CREATING TEST DATA

[75] Inventors: Ray Beffa; Eugene H. Cloud; Leland R. Nevill; Ken Waller, all of Boise; Warren M. Farnworth, Nampa, all of Id.

[73] Assignee: Micron Technology, Inc., Boise, Id.

[21] Appl. No.: 08/917,020

[22] Filed: Aug. 22, 1997

(Under 37 CFR 1.47)

[51] Int. Cl.[7] ................................................. G11C 7/00
[52] U.S. Cl. ........................................ 714/718; 365/201
[58] Field of Search ............................ 714/718; 365/201, 365/200

[56] References Cited

U.S. PATENT DOCUMENTS

| | | | |
|---|---|---|---|
| 5,157,629 | 10/1992 | Sato et al. ................................ | 365/201 |
| 5,245,577 | 9/1993 | Duesman et al. ........................ | 365/201 |
| 5,339,273 | 8/1994 | Taguchi .................................... | 365/201 |
| 5,381,368 | 1/1995 | Morgan et al. ..................... | 365/189.01 |
| 5,381,373 | 1/1995 | Ohsawa .................................... | 365/201 |
| 5,440,517 | 8/1995 | Morgan et al. .......................... | 365/202 |
| 5,453,954 | 9/1995 | Nakamura ................................ | 365/201 |
| 5,488,583 | 1/1996 | Ong et al. ................................ | 365/201 |
| 5,594,694 | 1/1997 | Roohparvar et al. .................... | 365/201 |
| 5,732,033 | 3/1998 | Mullarkey et al. ...................... | 365/201 |

Primary Examiner—Albert DeCady
Assistant Examiner—Esaw Abraham
Attorney, Agent, or Firm—Schwegman, Lundberg, Woessner & Kluth, P.A.

[57] ABSTRACT

A test arrangement for a memory device wherein the equilibration voltage DVC2 is adjusted up or down relative to a nominal value and coupled to one of the bitlines of the paired bitlines of the memory array, while the equilibrating circuit is held disabled, and then the sense amplifiers are used to pull the bitlines to logic 1 and logic 0 levels initializing the bitlines to test data. Appropriate word lines are fired to copy the test data to some or all of the other rows of the memory array, allowing memory tests to be conducted. In another embodiment, a fixed voltage is applied to one of the bitlines of individual bitlines pairs and the sense amplifiers are used to pull the paired bitlines to the correct voltage. In a further embodiment, fixed voltages Vcc and ground are applied to the bitlines of each bitline pair with the sense amplifier being held disabled. The test arrangement can be implemented as a self-test feature for the memory device.

26 Claims, 5 Drawing Sheets

6,094,734

TEST ARRANGEMENT FOR MEMORY DEVICES USING A DYNAMIC ROW FOR CREATING TEST DATA

FIELD OF THE INVENTION

The present invention relates to memory devices, and in particular, the invention relates to a test arrangement for memory devices wherein internal voltages of the memory device are used to initialize bitlines for producing test data for use in testing of the memory device.

BACKGROUND OF THE INVENTION

Semiconductor devices, such as dynamic random access memory (DRAM) devices, undergo a tremendous amount of testing at various steps in the production process. Moreover, many memory devices include self-test arrangements for determining that the memory device is functioning properly. Typically, DRAM devices are tested by using write and read operations to determine whether all of the cells of the memory array can properly store data signals and whether the data signals can be read out of the memory array. As memory chips become more dense, the testing time that is required to verify that data is being correctly stored and read out has increased dramatically.

In one test that is commonly used to identify faulty cells of a memory array, a signal having a logic level of either one or zero is applied to one group of the memory cells and signals of the opposite logic level are applied to the remaining cells. The signals are then read out of the cells individually and tested for the correct logic levels. This test must be repeated for each of the cells in the memory array and the entire procedure is repeated with signals of the opposite logic levels. Consequently, testing an array of memory cells requires a substantial amount of time.

Currently, predetermined data patterns are loaded, or sequenced through the memory as controlled by an external tester. Advanced testing procedures have used a row copy function to speed up testing. An example of a row copy function that can be used in testing of a memory is disclosed in U.S. Pat. No. 5,440,517. In such arrangements, a pattern of data bits is written to a memory array row using an external memory tester, and the data thus stored is copied to some or all of the other rows of the memory for programming the memory to a bit pattern desired for testing.

For the reasons stated above, and for other reasons stated below which will become apparent to those skilled in the art upon reading and understanding the present specification, there is a need in the art for a test arrangement that allows testing of memory devices, wherein the time required for conducting the testing is minimized and wherein space requirements on the memory chip for implementing the test arrangement are minimized.

SUMMARY OF THE INVENTION

The present invention provides a method for producing a pattern of test data in a memory array of a memory device allowing testing of the memory device. The method includes connecting pass circuitry between a voltage source and bitline pairs of the memory array and enabling the pass circuitry to apply the voltage to the bitlines to produce a difference in potential between individual pairs of the bitlines. The potential difference represents test data and the test data to which the bitlines are initialized is copied to a plurality of rows of the memory array, producing the pattern of test data.

In one embodiment, data that is written is determined by controlling an internal reference voltage generator of the memory circuit. For example, the equilibration voltage generator can be used with the equilibration voltage being adjusted up (or down) relative to the nominal value, and then applied to one of the bitlines of each bitline pair while the equilibration circuit is disabled. Sense amplifiers of the memory array responsively pulls one of the bitlines up to a logic high level while pulling the other bitlines down to a logic low level. In another embodiment a known fixed voltage is applied to one of the bitlines of each bitline pair and the sense amplifiers are enabled to pull the complementary bitlines to voltages representing complementary logic levels.

In accordance with a further embodiment, the pass circuitry includes a first group of the passgates that are used to apply a voltage at a first level to one of the bitlines of each pair of bitlines and a second group of passgates that are used to apply a voltage at a second level to the other bitline of each bitline pair. For example, a logic high level can be applied to the true state bitlines with a logic low level being applied to the complementary bitlines. In this embodiment, the sense amplifiers are maintained disabled.

In accordance with a further aspect of the invention, there is provided a circuit fabricated in an integrated circuit memory device for initializing paired bitlines of a memory array of the memory device for use in producing test data. The circuit comprises pass circuitry interposed between the paired bitlines and a source of a voltage for connecting the voltage to the paired bitlines, the pass circuitry including a plurality of pass gates and a controller circuit for producing an enabling signal for enabling the pass gates to connect the voltage to the paired digit lines to produce a difference in potential between the paired bitlines, wherein the difference in potential between individual pairs of bitlines represents known test data.

DESCRIPTION OF THE PREFERRED EMBODIMENTS

In the following detailed description of the preferred embodiments, reference is made to the accompanying drawings which form a part hereof, and in which is shown by way of illustration specific preferred embodiments in which the invention may be practiced. The preferred embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the appended claims.

Figure 1:
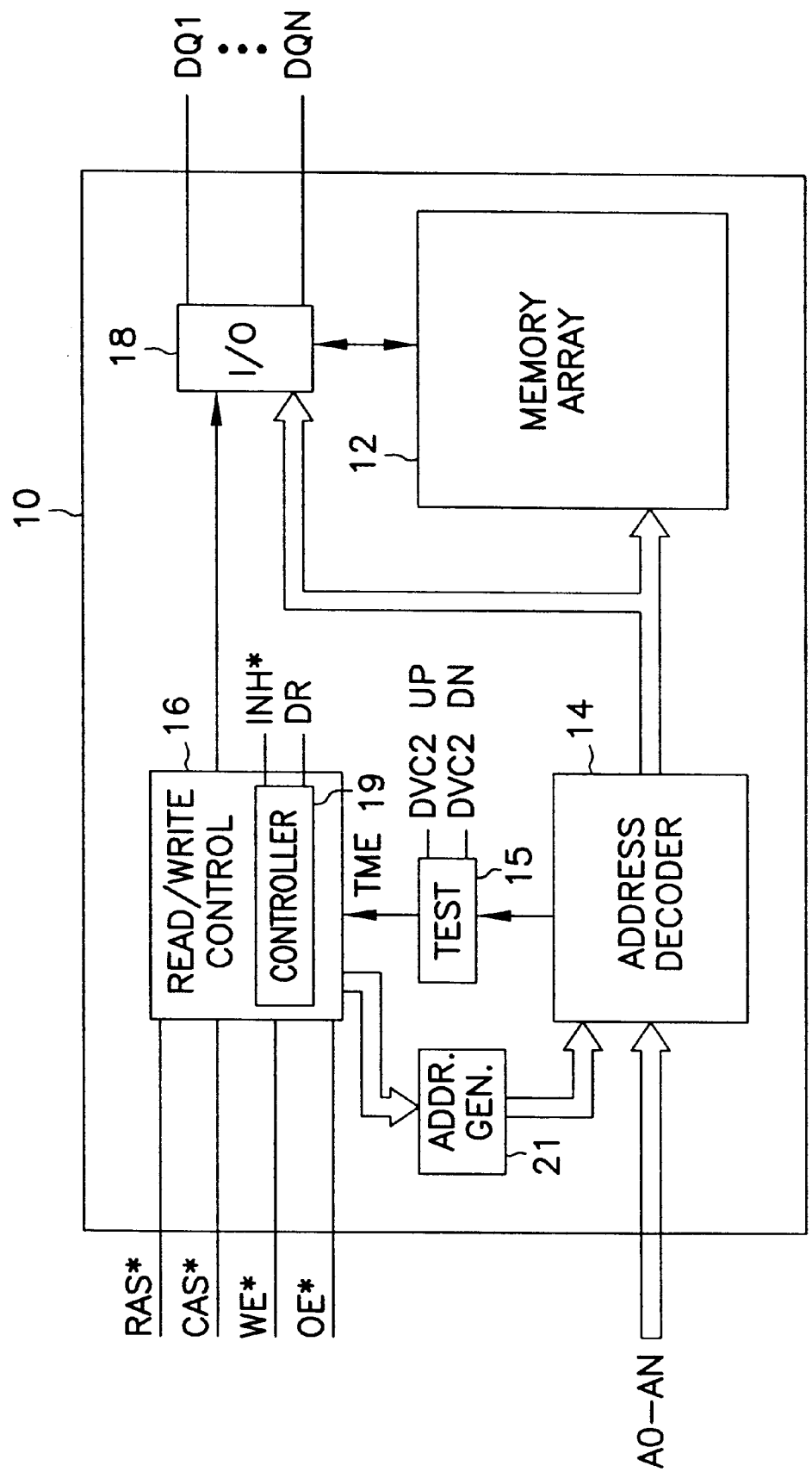
FIG. 1 is a simplified representation of a dynamic random access memory device incorporating the invention.

FIG. 1 is a simplified representation of a semiconductor memory device 10. In the exemplary embodiment, the semiconductor memory device is a dynamic random access memory (DRAM) device. Although the invention is described with reference to producing test data for use in the testing of DRAM devices, including SDRAM, SLDRAM and RDRAM devices, the invention is not limited to such application and can be used for producing test data in other types of memory devices. The basic memory device 10 is well known in the art to include a memory array 12, address decoder circuits 14, read/write control circuits 16 and input/output circuits 18.

Figure 2:
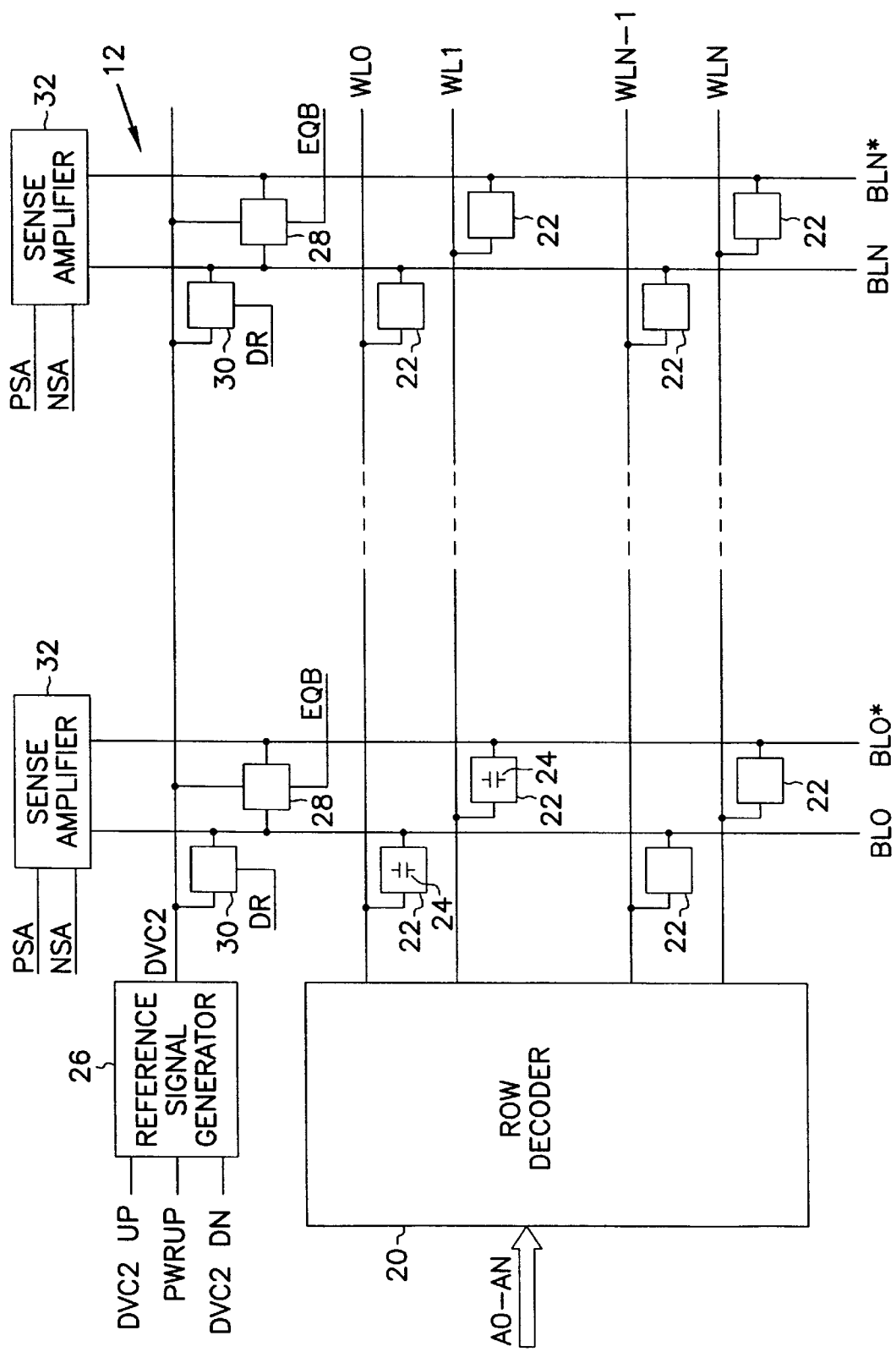
FIG. 2 is a block diagram of the memory array and data sensing and transfer circuits of the memory device of FIG. 1 and including a memory test pattern generation arrangement provided by the invention.

Referring additionally to FIG. 2, the memory array 12 is constructed of rows and columns of memory cells having inputs and outputs corresponding to rows and columns. In the example, the array has N rows and M columns with paired bit (data) lines BL0,BL0*; BL1 . . . BLN-1; BLN and word (address) lines WL0, WL1 . . . WLN-1, WLN. The bitlines BL0–BLN are used to write information into the memory cell and to read data stored in the memory cell. The row access, or word lines WL0–WLN are used to turn on an access device for all of the cells in the row including a memory cell or cells that data is to be written to or read from. The address decoder circuits 14 include row decoder circuits 20 which include bitline drivers and column decoder circuits (not shown) which control word line drivers to access the memory cells of the memory array 12 in response to address signals A0–AN that are provided by an external controller (not shown), such as a standard microprocessor. The input/output control circuits 18, shown in FIG. 1, control synchronous or asynchronous data communication between the memory device 10 (FIG. 1) and external devices. The memory device 10 additionally includes a test mode enable circuit 15 (FIG. 1) that is programmed to respond to coded addresses to produce test signals for enabling a plurality of tests to be conducted by the memory device during fabrication of the memory device, and for self-testing of the memory device during normal use of the memory device.

Referring to FIG. 1, a test controller 19 responds to a test enable signal TME produced by the test mode enable circuit 15, and using timing signals, such as the row address strobe signal RAS*, the equilibration enable signal EQB, and column address CAS* strobe signals which are produced during a conventional memory access cycle, establishes the timing sequence for conducting the memory test operations in accordance with the invention. For the memory test operations, row addresses can be applied externally to address inputs A0–AN for decoding by the address decoder 14 or generated internally by an address generator 21 for self-testing operations.

Referring to FIG. 2, the memory array 12 includes memory cells 22 formed as capacitors 24 which store data as a charge. A logical one is typically stored as VCC on the capacitor and a logical zero is typically stored as ground on the capacitor. An n-channel access transistor (not shown) is connected to each memory cell such that its source is connected to a memory cell and its drain is connected to one of the paired bitlines BL0, BL0* . . . BLN, BLN*. The access transistor is activated by raising its gate potential using one of the addressable row lines WL.

The DRAM device 10 includes conventional data sensing and transfer circuits, including a reference signal generating circuit 26, equilibration circuits 28 and sense amplifiers 32. The reference signal generating circuit 26 provides a precharge voltage DVC2 which is applied to the bitlines by the equilibration circuits 28 prior to memory read cycles. A separate equilibration circuit is provided for each pair of bitlines, and is connected between the associated bitlines, such as bitlines BL0 and BL0*. The equilibration circuits precharge the paired bitlines to the precharge voltage DVC2 and equalize the potentials of the paired bitlines in the manner known in the art. In addition, a separate sense amplifier 32 is connected to each of the paired bitlines. Each sense amplifier 32 includes an n-sense amplifier circuit and a p-sense amplifier circuit as will be shown.

Conventionally, to transfer data during a RAS*cycle, the bitlines are in equilibration by the activated equilibration circuits which couple the precharge voltage DVC2 provided by signal generating circuit 26 to the bitlines. Immediately after the active low, row address strobe signal (RAS*) becomes a logic low level, the equilibration circuit is turned off. Next, a selected word line is activated and the associated access transistor is turned on to connect a memory cell to one of the bitlines of the paired bitlines. The charge shared by the memory cell with the bitline will change the bitline potential by approximately ±200 millivolts. The differential between the paired bitlines is then sensed using the n-sense and p-sense amplifier circuits which comprise the sense amplifiers 32, as known to one skilled in the art.

In accordance with the invention, the reference voltage DVC2 that is used to equilibrate the bitlines can also be used to establish a test pattern of data bits in the memory to allow for testing of the memory. To this end, the reference signal generating circuit 26 can also be coupled to one of the pair of bitlines by pass circuits 30 provided by the invention. A separate pass circuit is provided for each bitline pair. Briefly, first, the equilibration voltage DVC2 is increased (or decreased) relative to a nominal value which is typically one-half the supply voltage Vcc. Then, while the equilibration circuits 28 are held disabled, the adjusted voltage DVC2 is coupled to one of the bitlines of each of the bitline pairs, such as the true state bitlines BL0 . . . BLN. The voltage differential between each pair of bitlines, such as bitlines BL0 and BL0* causes the n-sense amplifier circuit and the p-sense amplifier circuit of sense amplifier 32 to pull each bitline of the bitline pair a specific direction, to either a logic 1 or a logic 0 level. The test data is now initialized on the bitline pairs. The test data is copied to selected rows of the memory array, or into all of the rows of the memory array, by firing the row lines for those rows. In this way, a pattern of test data is stored in the memory array, allowing any memory test to be conducted. It is pointed out that the memory test data thus produced can initialize the bitlines to a logic 1 level so that logic 1 level data is written into the selected rows of the memory array. The test data producing operation can then be repeated to initialize the bitlines to a logic 0 level, and the logic 0 level data thus produced being written into some or all of the rows of the memory array to which logic 1 level bits have not been written.

Figure 3:
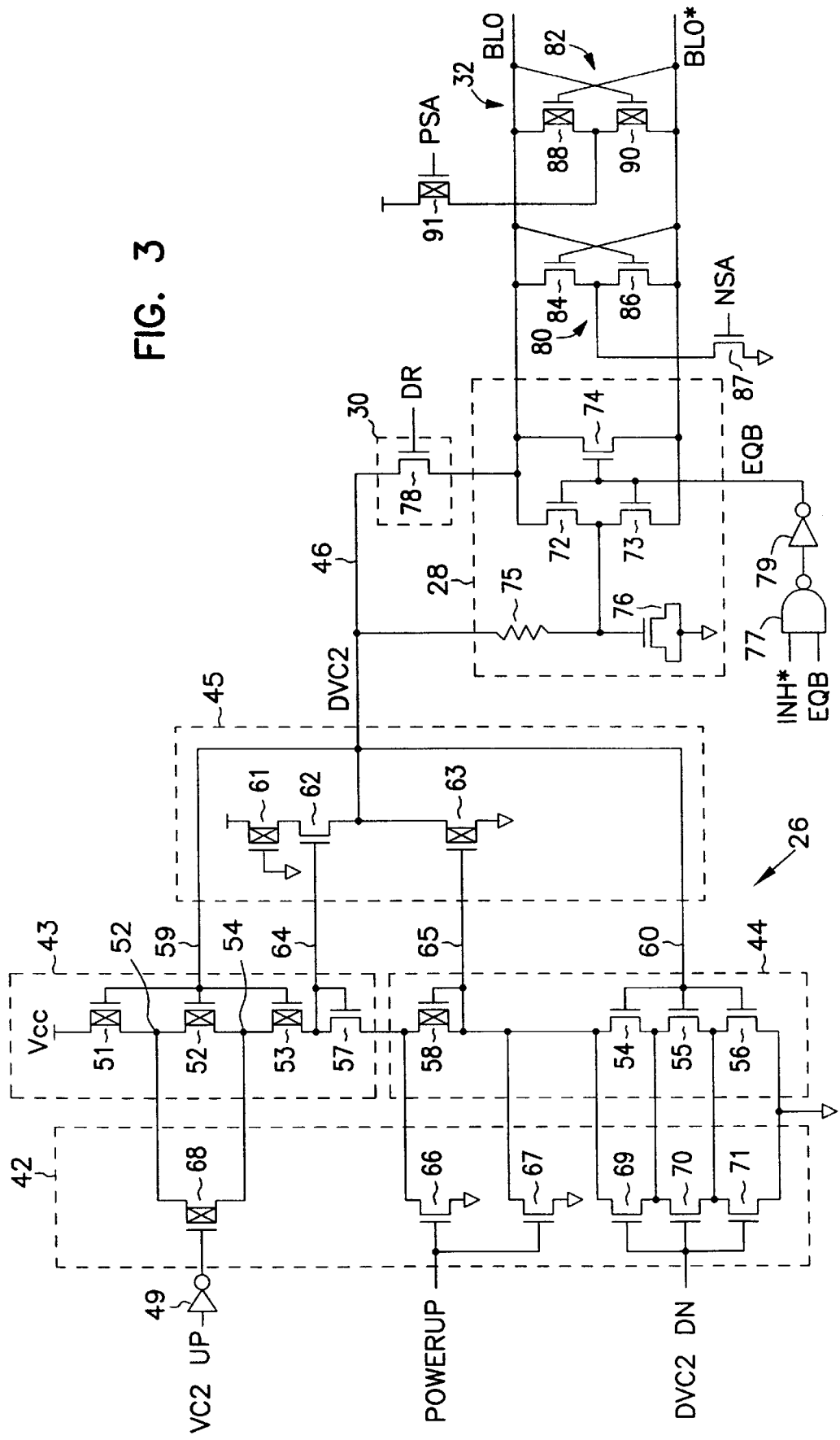
FIG. 3 is a schematic circuit diagram of a reference signal generating circuit of the memory device, the data sensing and transfer circuits for one of the paired bit lines of the memory array shown in FIG. 2, and illustrating a pass gate of the memory test pattern generation arrangement.

Referring to FIG. 3, the data transfer and sensing circuits for bitlines BL0 and BL0* and the signal generating circuit 26 are shown in detail, the data transfer and sensing circuits for the other bitline pairs of the memory array being identical to those for bitlines BL0 and BL0*. The signal generating circuit 26 produces the equilibration voltage DVC2 for all of the equilibration circuits 28 of the memory array. The signal generating circuit 26 is a conventional circuit that is adapted to derive the equilibration voltage DVC2 from the supply voltage Vcc. The nominal value of the equilibration voltage corresponds to one-half the supply voltage, or Vcc/2. The signal generating circuit 26 includes a control circuit 42, a pull-up section 43, a pull-down section 44, and an output driver section 45. The output of the output driver section 45, at node 46, is fed back to inputs of the pull-up section and the pull-down section so that if the output voltage DVC2 shifts up or down from a nominal value, the appropriate section 43 or 44 controls the output driver stage to return the output voltage DVC2 to the nominal value.

The signal generating circuit is enabled in response to a signal PWRUP to produce the equilibration voltage DVC2 at the output 46 of the signal generating circuit 26. The application of a test vector signal DVC2 UP produces an increase in the equilibration voltage relative to its nominal value. The application of a further test vector signal DVC2 DN produces a decrease in the equilibration voltage relative to its nominal value. The test vector signals DVC2 UP and DVC2 DN are produced by the test mode enable circuit 15 (FIG. 1) of the DRAM device in the manner known in the art. The output 46 of the signal generating circuit 26 is connected to the equilibration circuit 28 for bitlines BL0 and BL0*. The output 46 of the signal generating circuit 26 also is connected to the pass circuit 30 for bitlines BL0 and BL0*.

Considering the signal generating circuit 26 in more detail, in one embodiment, the pull-up section 43 includes series-connected p-type field-effect transistors 51–53. The pull-down section 44 includes series-connected n-type field-effect transistors 54–56. Diode-connected field-effect transistors 57 and 58 are connected between transistors 53 and 54, between the Vcc supply rail and ground, function as part of an enabling circuit for the output driver section and establish a voltage level differential between a pair of nodes 64 and 65. The gate electrodes of transistors 51–53 are commonly connected to a node 59 which is connected to the output 46 of the signal generating circuit. Similarly, the gate electrodes of transistors 54–56 are commonly connected to a node 60 which is connected to the output 46 of the signal generating circuit.

The output driver section 45 includes p-type field-effect transistor 61, n-type field-effect transistor 62, and p-type field-effect transistor 63 which are connected in series between the Vcc supply rail and the ground rail. The gate electrode of transistor 61 is connected to ground so that the transistor is gated on whenever power is being applied to the signal generating circuit. The gate electrode of transistor 62 is connected to node 64, the potential at node 64 being established by transistors 51–53 of the pull-up section. The gate electrode of transistor 63 is connected to a node 65, the potential of node 65 being established by transistors 54–56 of the pull-down section 44. The enabling circuit for the output driver section further comprises n-type transistors 66 and 67, which respond to the powerup signal PWRUP to supply a bias level at the gate electrode of transistor 63 and a path to ground for the pull-up section 43.

The control circuit 42 allows adjustment in the voltage DVC2 from its nominal value. This function is accomplished with transistor sizing in the manner known in the art. To this end, the control circuit 42 includes p-type field-effect transistor 68 which is connected in parallel with transistor 52, which is a long transistor. The test vector DVC2 UP is coupled through an inverter 49 to the gate electrode of transistor 68. In addition, n-type field-effect transistors 69, 70 and 71 are connected in parallel with long transistors 54, 55 and 56, respectively. The gate electrodes of transistors 69–71 are commonly connected to receive the test vector DVC2 DN.

Referring additionally to FIG. 2, the equilibration circuits 28, the pass circuits 30 and the sense amplifiers 32 associated with the paired bitlines BL0, BL0* . . . BLN, BLN* are identical, and so only the equilibration circuit 28, the pass circuit 30 and the sense amplifier 32 associated with the paired bitlines BL0 and BL0* will be described. The equilibration circuit 28 includes n-channel field effect transistors 72 and 73 which are connected in series between the paired bitlines BL0 and BL0*. The gate electrodes of the transistors 72 and 73 are commonly connected to the gate electrode of a further n-channel field effect transistor 74 which is connected between bitlines BL0 and BL0*. The gate electrodes of the transistors 72–74 are connected to receive an enabling signal EQB that is produced by the read/write control circuits 16 (FIG. 1). The signal EQB is gated to the equilibration circuits 28 through a NAND gate 77 and an inverter 79 only when an active low signal INH* provided by the test controller 19 (FIG. 1) is at a logic high level. The junction of the source and drain electrodes of the transistors 72 and 73 is connected to a divider circuit that is formed by a resistance 75 and a capacitance 76, which are connected between the output 46 of the signal generating circuit 26 and ground.

Each pass circuit 30 includes an n-channel field effect transistor 78 which is connected between the output 46 of the signal generating circuit 26 and one of the bitlines, such as bitline BL0, of the paired bitlines BL0, BL0*. The gate electrode of transistor 78 is connected to receive an enabling signal DR which is produced by the test controller 19 (FIG. 1).

The pass transistors 78 are controlled in the manner of row activation during memory cell selection for read or write operation, with the pass transistors 78 for all of the bitline pairs being enabled at once in response to a signal DR. The pass transistors 78 can be fabricated as part of the memory array or separate from the memory array. When fabricated as part of the memory array, the pass transistors can comprise devices that are produced as part of the process of fabricating the memory device but which normally are not used in the basic memory device. That is, the pass transistors 78 can be fabricated in spare or dummy rows of the memory array. The dummy rows of the memory array are produced as the result of the pattern that is used to form access transistors of the memory cells being stepped out to the edge of the subarrays during fabrication of the memory array so as to provide a buffer area around the active elements of the memory array.

Sense amplifier 32 includes an n-sense amplifier circuit 80 and a p-sense amplifier circuit 82, both of which are conventional circuits. The n-sense amplifier circuit 80 is comprised of a pair of cross-coupled n-channel transistors 84 and 86. The source electrodes of transistors 84 and 86 are coupled to ground by n-type transistor 87 which has a gate electrode connected to enable line NSA. The NSA line is typically held at one-half the supply voltage (Vcc) and is strobed low by the read/write control circuits 16 (FIG. 1) during memory access cycles to sense data stored on a selected memory cell. Similarly, each p-sense amplifier circuit is comprised of a pair of cross-coupled p-channel transistors 88 and 90. The source electrodes of the p-channel transistors 88 and 90 are coupled to Vcc by p-type transistor 91 which has a gate electrode connected to enable line PSA which is normally held to one-half the supply voltage and is strobed high by the read/write control circuits 16 during memory access cycles to sense data stored on the memory cells.

The manner in which a pattern of test data is produced and stored in the memory array 12 in accordance with the invention will be described with reference to FIGS. 1–3. For purposes of description of the memory test data pattern generation, it is assumed that the memory device 10 is being operated in a test mode and that initially, the signal PWRUP is provided so that the equilibration voltage DVC2 is being produced by the reference signal generating circuit 26. The test controller 19 initiates the test pattern generation in response to a test enable signal produced by the test mode enable circuit 15. The test controller 19 uses timing signals, such as the row address strobe signal RAS*, the equilibration enable signal EQB, and the column address strobe CAS* signal, which are produced by the read/write control circuits 16 of the DRAM device 10 during conventional memory access cycles, to establish the proper timing sequence for test pattern generation in accordance with the invention. Briefly, the test data generation operation according to the invention includes test data production by initializing the bitlines to known voltages, followed by writing the test data to which the bitlines are initialized to the some or all of the rows of the memory array using a conventional write operation.

More specifically, first, the equilibration is released by preventing the application of the equilibration enable signal EQB to the equilibration circuits 28 so that transistors 72–74 of the equilibration circuits 28 are held disabled. The equilibration circuits 28 are held disabled by the signal INH* provided by the test controller 19 becoming a logic low level, disabling the NAND gate 77. Then, the value of DVC2 is adjusted up or down, depending upon the test to be conducted, by supplying a coded address to the test mode enable circuit 15 (FIG. 1) while the memory device is being operated in the test mode. Assuming that the data bits of the test pattern are to be at a logic 1 level, the test mode decoder responds to a coded address to produce the test vector DVC2 UP. The test Vector DVC2 UP is inverted by inverter 49 and is applied to the gate electrode of transistor 68. This enables transistor 68 to divert current around transistor 52, raising the reference level on node 64 towards Vcc. Consequently, the pull-up section 43 increases the output voltage DVC2 at output node 46 to a higher value, providing a modified or adjusted value DVC2+δ for the equilibration voltage DVC2.

After the equilibration voltage DVC2 has been adjusted, the signal DR is provided by the test controller 19 (Figure). The signal DR enables all of the transistors 78 of the pass circuits 30, coupling the output of the signal generating circuit 26 to all of the true state bitlines BL0 . . . BLN of the memory array 12. The true state bitlines BL0 . . . BLN are charged to the adjusted value of the equilibration voltage DVC2+δ. The change or shift in the voltage DVC2 will be seen on the bitlines BL0. At this time, transistors 72, 73 & 74 are off before DR is on. The signal DR is then terminated, disabling the pass transistors 78. Those skilled in the art will readily recognize that the DVC2+δ voltage could alternately be applied to bitlines BL0* within the teaching of the present invention.

Then, the n-sense amplifier circuits, such as the n-sense amplifier circuit 80, are then strobed by raising the voltage on the enable line NSA. Because each bitline, such as bitline BL0, is at a positive level, the n-sense amplifier circuit 80 pulls bitline BL0* to a logic low level, such as ground potential. The p-sense amplifier circuits, such as p-sense amplifier circuit 82, are then strobed by lowering the voltage on the enable line PSA. The p-sense amplifier circuit 82 pulls the bitline BL0 toward a logic high level, such as the supply voltage Vcc. The sense amplifier circuits 80 and 82, when strobed, pull the true state bitlines BL0 . . . BLN to full power rail potential Vcc and pull the complementary bitlines BL0* . . . BLN* to ground.

Then, appropriate word lines WL0 . . . WLN are fired to write the test data to the selected rows of the memory array. This causes the data state indicated on the paired bitlines to be copied into the cells of the activated rows, so that a data pattern is produced in the memory array. The test data can be copied to selective rows of the memory array or to all of the rows of the memory array by activating the word lines associated with the selected rows. Also, as has been indicated, test data can be written to only selected rows.

The test data pattern generation procedure can be repeated producing complementary data on bitlines BL0, BL0* . . . BLN,BLN* to be written into the remaining rows to which test data has not been written. In this operation, the test vector DVC2 DN is applied to the signal generating circuit 26 which provides an adjusted voltage DVC2-δ for the equilibration voltage DVC2. The sense amplifiers 80 and 82 respond to this voltage to pull the true state bitlines BL0 . . . BLN to ground and pull the complementary bitlines BL0* . . . BLN* to full power rail potential Vcc. In this mode, the reference signal generating circuit functions as an adjustable voltage source or adjustable node which is controllable internally of the memory device.

Thus, the bitlines effectively function as a dynamic ROM row and can be initialized to a first known state to allow first known test data to be written into selected rows of the memory array and then be initialized to the opposite state and then written into the remaining the rows of the memory array. Also, the variable test pattern generation can be implemented as a memory self-test arrangement for the memory device.

Figure 4:
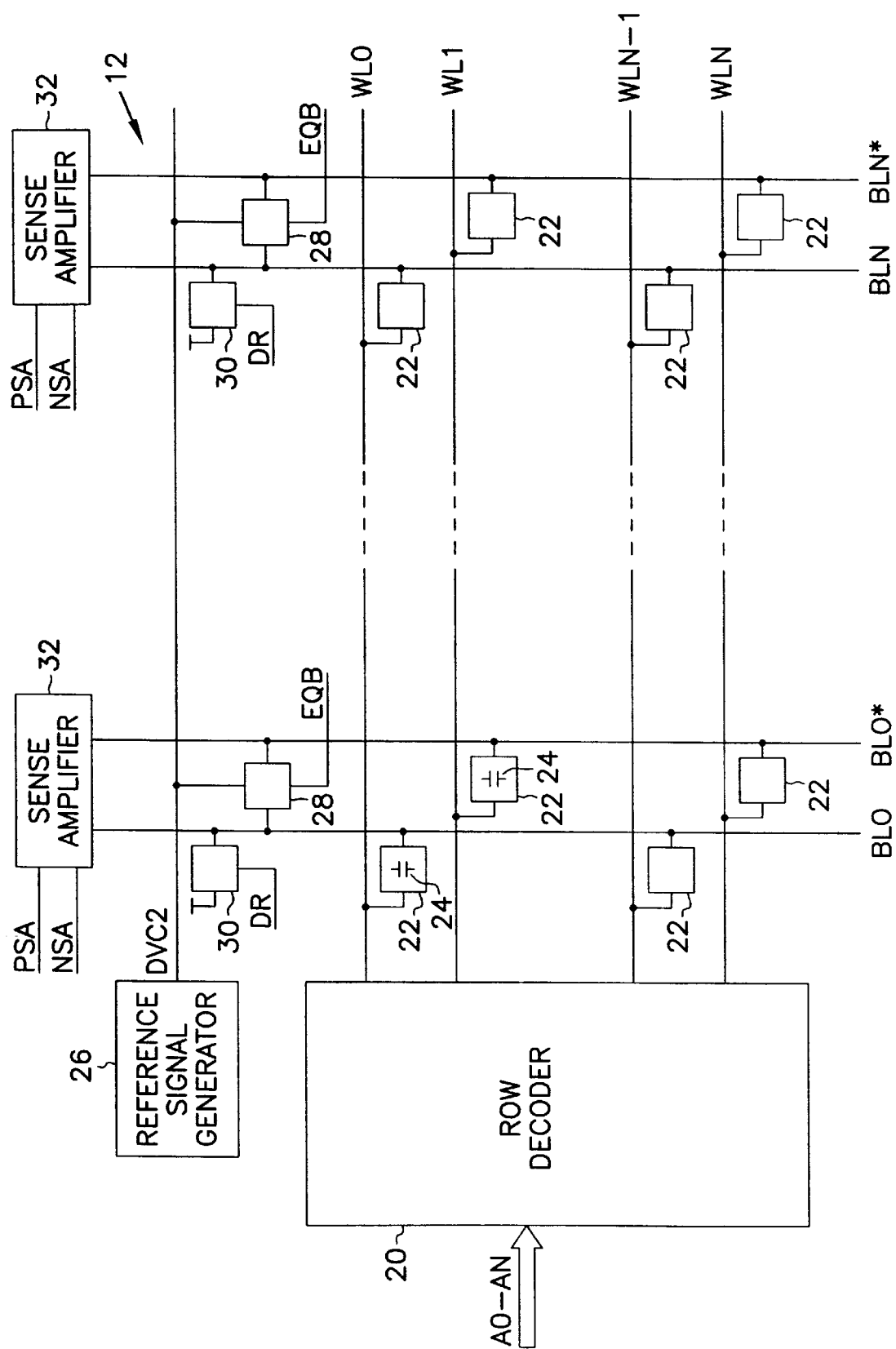
FIG. 4 is a block diagram of the memory array and data sensing and transfer circuits of the memory array and including a further embodiment of a memory test pattern generation arrangement provided by the invention.

Referring now to FIG. 4, in accordance with a further embodiment of the invention, test data is written to the memory array by coupling a fixed internal voltage of the memory device, such as the supply rail voltage Vcc, ground or some other voltage, to the paired bitlines BL0 . . . BLN of the memory array. The voltage is coupled to the bitlines by activating a plurality of pass circuits that can be the same as the pass circuits 30 described above, and which comprise n-type, field-effect transistors, such as transistor 78 shown in FIG. 3. However, in this embodiment, the pass circuits couple the output of a fixed voltage source, such as the Vcc supply rail, to one of the bitlines, such as the true state bitlines BL0 . . . BLN of each bitline pair. The pass transistors can be located in a dummy row of the memory array 12.

The procedure for producing test data for the memory array is similar to that described above with reference to FIGS. 2–3. By way of example, it is assumed that the memory device is being operated in the test mode and that logic high level bits are to be stored in selected rows of the memory array. First, the equilibrating circuits 28 are disabled. Then, the signal DR is activated to enable all of the pass circuits 30 so that the voltage Vcc is applied to all of the true state bitlines BL0 . . . BLN. DR stays on until the sense amplifier fires or until the write cycle is complete. The sense amplifiers 32 for all of the bitlines are fired to bring the bitlines of each bitline pair to voltages representing data. In the example, where the supply voltage Vcc is applied to the true state bitlines BL0 . . . BLN, the sense amplifiers 32 pull the complementary bitlines BL0* . . . BLN* to ground and pull bitlines BL0 . . . BLN to full rail voltage Vcc. Conversely, if ground were applied to the true state bitlines BL0 . . . BLN, the sense amplifiers 32 would pull the complementary bitlines BL0* . . . BLN* to the voltage Vcc.

Then, appropriate word lines WL0 . . . WLN are fired to cause the test data to which the bitlines have been initialized to be written into some or all of the memory rows depending upon the word lines that are fired. It is pointed out that in the embodiment illustrated in FIG. 4, the pass circuits connect a single voltage source to the true state bitlines. A further plurality of pass circuits can be provided to connect a different potential, such as ground, to the true state bitlines BL0 . . . BLN, with only one group of the pass circuits being enabled at a time in producing a given pattern of test data. Also, although the pass circuits shown in FIG. 4 function to connect a voltage to the bitlines BL0 . . . BLN, the pass circuits can be connected to couple voltages to the bitlines BL0* . . . BLN*, rather than to bitlines BL0 . . . BLN.

Figure 5:
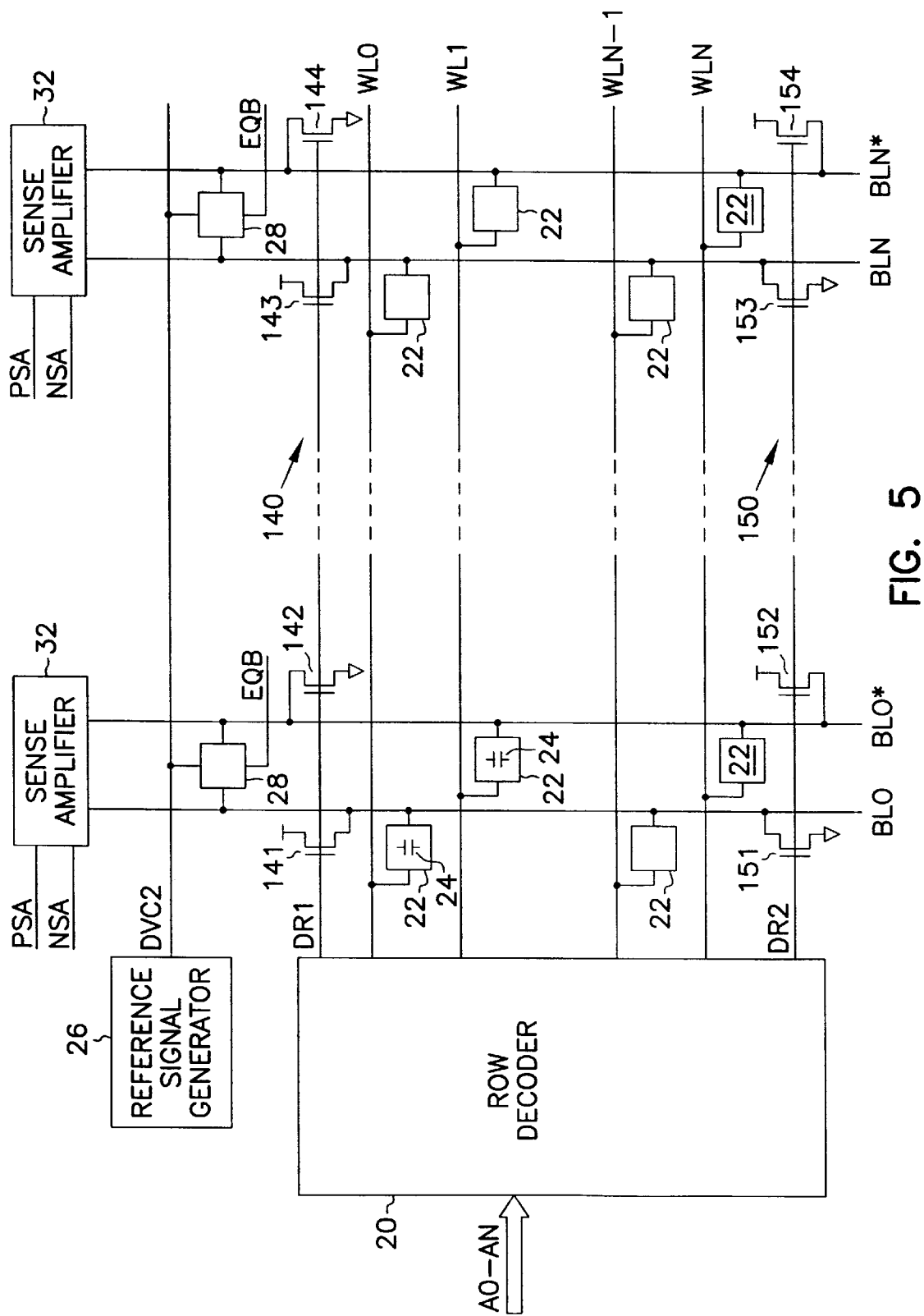
FIG. 5 is a block diagram of the memory array and data sensing and transfer circuits of the memory array in accordance including another embodiment of a memory test pattern generation arrangement provided by the invention.

Referring now to FIG. 5, in accordance with another embodiment of the invention, test data is written to the memory array by coupling fixed internal voltages to both of the bitlines of the individual bitline pairs of the memory array. For example, the supply voltage Vcc (or ground) can be coupled to the true state bitlines BL0 . . . BLN of each of the paired bitlines with ground (or the supply voltage) being coupled to the complementary bitlines BL0* . . . BLN* of the bitline pairs. The voltages are coupled to the bitlines by activating pass circuitry including a plurality of pass transistors.

As is shown in FIG. 5, the memory array includes two dummy rows 140 and 150. The dummy row 140 includes a plurality of pass transistors, such as pass transistors 141–144 shown in FIG. 5. Transistor 141 has its source-drain circuit connected between the Vcc supply rail and bitline BL0. Transistor 142 has its source-drain circuit connected between ground and bitline BL0*. Transistor 143 its source-drain circuit connected between the Vcc supply rail and bitline BLN. Transistor 144 has its source-drain circuit connected between ground and bitline BLN*. The gates of the pass transistors 141–144 are connected to a word line DR1 of the memory array.

Similarly, dummy row 150 includes a plurality of pass transistors, such as pass transistors 151–154 shown in FIG. 5. Transistor 151 has its source-drain circuit connected between the ground supply rail and bitline BL0. Transistor 152 has its source-drain circuit connected between the Vcc supply rail and bitline BL0*. Transistor 153 has its source-drain circuit connected between the ground supply rail and bitline BLN. Transistor 154 has its source-drain circuit connected between the Vcc supply rail and bitline BLN*. The gates of the pass transistors 151–154 are connected to word line DR2 of the memory array 12. This arrangement provides flexibility in that a logic high level can be applied to all of the true state bitlines while a logic low level is being applied to all of the complementary bitlines, or a logic low level can be applied to all of the true state bitlines while a logic high level is being applied to all of the complementary bitlines. In this embodiment, the sense amplifiers 32 are not fired and thus are not used to pull one or both of the bitlines of bitline pairs to known potentials in the manner described above with reference to FIGS. 3 and 4.

Although the pass transistors 141–144 and 151–154 preferably are fabricated in a dummy row of the memory array, the pass transistors 141–144 and 151–154 can be fabricated on the integrated circuit memory device separate from the memory array. However, in either arrangement, the signal lines DR1 and DR2 function similar to word lines of the memory array and with signal DR1 simultaneously enabling all of the pass transistors 141–144 and signal DR2 simultaneously enabling all of the pass transistors 151–154.

To provide test data, such as logic high level bits, in all of the cells of the memory array, the equilibrating circuits 28 are disabled and then word line DR1 is activated to enable all of the pass transistors, such as pass transistors 141–144, so that voltage Vcc is applied to bitlines BL0 . . . BLN and ground is applied to the complementary bitlines BL0* . . . BLN*. The sense amplifiers 32 are maintained disabled. Then, appropriate word lines are enabled to copy to selected rows of the memory array, the test data to which the bitlines have been initialized.

By enabling signal line DR2, the test data that is produced is complementary to that provided when signal line DR1 is enabled. This test data can be written to previously non-selected rows of the memory array so that the resultant test pattern includes logic high level data in certain rows of the memory array and logic low level data in other rows of the memory array.

Thus, it has been shown that the invention produces test data patterns for use in testing of a memory device. In one embodiment, the equilibration voltage produced by the internal DVC2 signal generating circuit of the memory device is adjusted up (or down) and then applied to one of the bitlines of the individual bitline pairs of the memory array and the sense amplifiers are enabled to pull the bitlines of individual bitline pairs to complementary states, producing a potential difference between the paired bitlines that represents test data. The test data is copied to some or all of the memory cells in some or all of the rows of the memory array by selectively activating the appropriate word lines. The test data thus produced can be used in testing of the memory device to ensure that each memory cell can successfully store a "1" and a "0" regardless of the data in any other memory cell. In a further embodiment, a fixed voltage, such as the supply rail voltage Vcc or ground is coupled to only one of bitlines of the individual bitline pairs and the sense amplifier circuits are used to pull both lines of bitline pair to the proper voltage levels. In another embodiment, pass transistors are used to couple the bitlines of a bitline pair to a fixed voltage, such as the supply rail voltage Vcc or ground while the sense amplifiers are held disabled. The test data pattern generation arrangement can be implemented as a self-test arrangement for the memory device.

What is claimed is:

1. A method for producing a pattern of test data in a memory array of a memory device to allow testing of the memory device, wherein the memory array includes a plurality of paired bitlines and wherein data is represented by a difference in potential between individual pairs of the bitlines; said method comprising the steps of:

connecting pass circuitry between a source of a voltage and at least one of the bitlines of each pair of bitlines;

producing a difference in potential between the paired bitlines by enabling the pass circuitry to apply the voltage to the paired bitlines, the difference in potential representing test data; and copying the test data on the paired bitlines to at least certain rows of the memory array for producing the pattern of test data.

2. The method according to claim 1, wherein the step of producing a difference in potential between paired bitlines includes enabling the pass circuitry to apply the voltage to only one of the bitlines of each pair of bitlines, and enabling sense amplifiers of the memory array to respond to the voltage on said ones of the bitlines of each bitline pair and produce the difference in potential between the paired bitlines.

3. The method according to claim 2, wherein the sense amplifiers cause a voltage corresponding to a first logic level to be provided on one bitline of each pair of bitlines and cause a voltage corresponding to a second logic level to be provided on the other bitline of each pair of bitlines.

4. The method according to claim 3, wherein the voltage is an equilibration voltage for the memory device, and wherein the memory device includes an equilibrating circuit for applying the equilibration voltage to the paired bitlines, and including the steps of adjusting the equilibration voltage to produce a voltage for application to the bitlines for producing the test data, and disabling the equilibration circuit while the test data is being produced.

5. The method according to claim 4, wherein the step of adjusting the equilibration voltage includes the steps of controlling an equilibration voltage generator to increase the magnitude of the equilibration voltage to produce an adjusted voltage that is greater than the magnitude of a nominal value of the equilibration voltage, and enabling sense amplifiers of the memory array to respond to the adjusted voltage and increase the voltage on said ones of the bitlines to a voltage corresponding to the first logic level while decreasing the voltage on the other bitlines of each pair of bitlines to a voltage corresponding to the second logic level.

6. The method according to claim 4, wherein the step adjusting the equilibration voltage includes the steps of controlling an equilibration voltage generator to decrease the magnitude of the equilibration voltage to produce an adjusted voltage that is less than the magnitude of a nominal value of the equilibration voltage, and enabling sense amplifiers of the memory array to respond to the adjusted voltage and decrease the voltage on said ones of the bitlines to a voltage corresponding to the second logic level while increasing the voltage on the other bitlines of each pair of bitlines to a voltage corresponding to the first logic level.

7. The method according to claim 1, wherein the step of producing a differential voltage between paired bitlines includes enabling first pass gates interposed between the output of a source of a first voltage and one of the bitlines of each pair of bitlines, and enabling second pass gates interposed between the output of a source of a second voltage and the other bitlines of each pair of bitlines.

8. The method according to claim 1, wherein the step of producing a differential voltage between paired bitlines includes enabling first pass gates to connect a voltage corresponding to a first logic level to one of the bitlines of each pair of bitlines, and enabling second pass gates to connect a voltage corresponding to a second logic level to the other bitlines of each pair of bitlines.

9. A method for initializing paired bitlines of a memory array of a memory device to provide test data for use in testing of the memory device, wherein data is expressed as a difference in potential between the paired bitlines, said method comprising the steps of:

connecting pass circuitry between the bitlines and a source of a voltage; and producing a difference in potential between individual pairs of the bitlines by enabling the pass circuitry to apply the voltage to at least one of the bitlines of each pair of bitlines.

10. The method according to claim 9, wherein producing a difference in potential between individual pairs of bitlines includes enabling first pass gates to connect a voltage corresponding to a first logic level to one of the bitlines of each pair of bitlines and enabling second pass gates to connect a voltage corresponding to a second logic level to the other bitline of each pair of bitlines.

11. The method according to claim 9, wherein producing a difference in potential between individual pairs of bitlines includes applying the voltage to only one of the bitlines of each pair of bitlines, and enabling sense amplifiers of the memory array to respond to the voltage on said ones of the bitlines of each bitline pair and produce a difference in potential representing test data between the individual pairs of bitlines.

12. The method according to claim 11, wherein the voltage is an equilibration voltage for the memory device, and including the step of adjusting the equilibration voltage to produce a voltage for application to the bitlines for producing the test data.

13. A method for initializing paired bitlines of a memory array of a memory device to provide test data for use in testing of the memory device, wherein data is expressed as a difference in potential between the paired bitlines, said method comprising the steps of:

applying a known voltage to one of the bitlines of each of the paired bitlines; and enabling sense amplifiers of the memory array to respond to the known voltage applied to said ones of the bitlines of each pair of bitlines and produce a potential difference between the paired bitlines that represents test data.

14. The method according to claim 13, including enabling the sense amplifiers to cause a voltage corresponding to a first logic level to be provided on one bitline of each pair of bitlines and to cause a voltage corresponding to a second logic level to be provided on the other bitline of each pair of bitlines.

15. The method according to claim 14, wherein the voltage is an equilibration voltage for the memory device, and wherein the memory device includes an equilibrating circuit for applying the equilibration voltage to the paired bitlines, and including the steps of adjusting the equilibration voltage to produce the known voltage for application to the bitlines for producing the test data, and disabling the equilibration circuit while the test data is being produced.

16. The method according to claim 15, wherein the step of adjusting the equilibration voltage includes the steps of controlling an equilibration voltage generator to increase the magnitude of the equilibration voltage to produce an adjusted voltage that is greater than the magnitude of a nominal value of the equilibration voltage, and enabling the sense amplifiers of the memory array to respond to the adjusted voltage and increase the voltage on said ones of the bitlines of each bitline pair to a voltage corresponding to the first logic level while decreasing the voltage on the other bitlines of each pair of bitlines to a voltage corresponding to the second logic level.

17. The method according to claim 15, wherein the step adjusting the equilibration voltage includes the steps of controlling the equilibration voltage generator to decrease the magnitude of the equilibration voltage to produce an adjusted voltage that is less than the magnitude of a nominal value of the equilibration voltage, and enabling the sense amplifiers of the memory array to respond to the adjusted voltage and decrease the voltage on said ones of the bitlines of each bitline pair to a voltage corresponding to the second logic level while increasing the voltage on the other bitlines of each pair of bitlines to a voltage corresponding to the first logic level.

18. A circuit fabricated in an integrated circuit memory device for initializing paired bitlines of a memory array of the memory device for use in producing test data, said circuit comprising:

pass circuitry interposed between the paired bitlines and a source of a voltage for connecting the voltage to the paired bitlines, said pass circuitry including a plurality of pass gates; and a controller for producing an enabling signal for enabling said pass gates to connect the voltage to said paired digit lines to produce a difference in potential between the paired bitlines, wherein the difference in potential between individual pairs of bitlines represents known test data.

19. The circuit according to claim 18, wherein each of said pass gates comprises a field-effect transistor having a control electrode connected to said controller, and a source-to-drain circuit interposed between one of said bitlines and the voltage source, and said transistors being enabled in response to said enabling signal to couple the voltage to said one bitline.

20. The circuit according to claim 19, wherein said memory device includes a test mode enable circuit for providing a test mode signal for operating the memory device in a test mode, and wherein said controller is enabled to provide said enabling signal only when said test mode signal is being provided.

21. The circuit according to claim 18, wherein the memory array includes a plurality of memory cells arranged in a plurality of rows and a plurality of columns, and a plurality of word lines for addressing the rows of memory cells; and including an addressing circuit for activating at least selected ones of the word lines for writing the test data to which the bitlines are initialized into memory cells in selected rows of the memory array.

22. A memory device comprising:

a memory array including a plurality of memory cells arranged in a matrix of rows and columns;

a plurality of word lines for accessing corresponding rows of memory cells;

a plurality of paired bitlines for carrying data to and from the memory cells, the data being expressed as a difference in potential between the bitlines in individual pairs;

a source of a voltage;

pass circuitry interposed between the bitlines and the voltage source; and a controller for enabling the pass circuitry to connect the voltage to the paired bitlines for producing a difference in potential between the individual pairs of bitlines that represents test data.

23. The memory device according to claim 22, wherein said memory array includes at least one dummy row, and wherein said pass circuitry comprises a plurality of pass gates, said pass gates being contained in the dummy row and said pass gates being addressable by a common row address.

24. The memory device according to claim 22, including a source of an equilibration voltage, and at least one equilibrating circuit for coupling the equilibration voltage to the paired bitlines and for equalizing the potentials on the paired bitlines, an adjusting circuit for controlling the source of the equilibration voltage for adjusting the magnitude of the equilibration voltage;

and wherein the memory array includes sense amplifiers, the sense amplifiers responding to the adjusted voltage to produce known test data for the memory array.

25. The memory device according to claim 24, wherein the controller includes an inhibit circuit for preventing said equilibrating circuit from equalizing the potentials on the paired bitlines while the test data is being produced.

26. The memory device according to claim 25, wherein the adjusting circuit includes a test enable circuit for producing a first test vector for controlling the source of the equilibration voltage to increase the magnitude of the equilibration voltage from a nominal value and for producing a second test vector for controlling the source of the equilibration voltage to decrease the magnitude of the equilibration voltage from the nominal value.

* * * * *